US005578857A

United States Patent [19]

Hong et al.

[11] Patent Number: 5,578,857
[45] Date of Patent: Nov. 26, 1996

[54] DOUBLE POLY HIGH DENSITY BURIED BIT LINE MASK ROM

[75] Inventors: Gary Hong; Ming-Tzong Yang; Chen-Chiu Hsue, all of Hsin-Chu, Taiwan

[73] Assignee: United Microelectronics Corporation, Hsin-chu, Taiwan

[21] Appl. No.: 349,432

[22] Filed: Dec. 5, 1994

Related U.S. Application Data

[62] Division of Ser. No. 92,190, Jul. 14, 1993, Pat. No. 5,393,233.

[51] Int. Cl.$^6$ .................................................. H01L 29/76
[52] U.S. Cl. ........................... 257/391; 257/402; 257/797
[58] Field of Search ................................ 257/390, 391, 257/402, 797; 365/104

[56] References Cited

U.S. PATENT DOCUMENTS

| | | | |
|---|---|---|---|
| 5,067,001 | 11/1991 | Choi | 257/900 |
| 5,317,534 | 5/1994 | Choi et al. | 365/182 |
| 5,394,356 | 2/1995 | Yang | 257/381 |

Primary Examiner—Robert P. Limanek
Attorney, Agent, or Firm—Meltzer, Lippe, Goldstein, et al.

[57] ABSTRACT

In accordance with the invention, a double poly process is used to double the memory density of a buried bit line ROM on the same silicon area. In particular the word-line pitch is decreased to increase the cell density in a direction perpendicular to the word lines. The invention uses a self-aligned method for ROM code implantation and a polyplanarization by chemical-mechanical polishing (CMP) to achieve a self aligned double poly word line structure.

3 Claims, 5 Drawing Sheets

DOUBLE POLY HIGH DENSITY BURIED BIT LINE MASK ROM

This is a division of application Ser. No. 08/092,190, filed Jul. 14, 1993, now U.S. Pat. No. 5,393,233.

FIELD OF THE INVENTION

This invention relates to a method for manufacturing a Read Only Memory (ROM) and more particularly to a method of producing high density Read Only Memory devices by making self-aligned and closely spaced polysilicon lines.

RELATED APPLICATION

A patent application entitled "Read Only Memory Manufacturing Method" bearing Ser. No. 07/941,807 has been filed on Sep. 8, 1992, now U.S. Pat. No. 5,264,386 and is assigned to the assignee hereof. This patent contains subject matter related to the subject matter of the present application and is incorporated herein by reference.

BACKGROUND OF THE INVENTION

A conventional buried bit line ROM device 10 is illustrated in FIG. 1. Consider the case where the substrate 12 is P-type silicon. A plurality of spaced apart $N^+$-type bit lines 14 are diffused into the substrate. A plurality of spaced apart polysilicon word lines 16 are formed on top of the substrate. A single ROM cell is designated 18 in FIG. 1. Each individual ROM cell 18 has a source and drain regions 19, 20 formed by portions 21 and 22 of two adjacent bit lines. The channel L between the sourced and drain regions 20, 21 is located under the polysilicon word line 16. Prior to the formation of the polysilicon word line, the cell may be permanently placed in the off state or on state by the ion implantation of P-type or N-type impurities respectively.

A buried bit line Read Only Memory device of this type is discussed in detail in Mikiro Okada et al, "16 Mb ROM Design Using Bank Select Architecture," Integrated Circuits Group, Sharp Corporation, 2613-1, Ichinomoto, Tenri, Nara 532 Japan.

The cell size in a direction perpendicular to the word line direction is determined by the poly pitch (polysilicon word line plus spacing between lines).

It is an object of the present invention to increase the density of cells in a buried bit line ROM by decreasing the poly pitch of the word lines.

SUMMARY OF THE INVENTION

In accordance with the invention, a double poly process is used to double the memory density of a buried bit line ROM on the same silicon area. In particular the word-line pitch is decreased to increase the cell density in a direction perpendicular to the word lines. The invention uses a self-aligned method for ROM code implantation and a polyplanarization by chemical-mechanical polishing (CMP) to achieve a self aligned double poly word line structure.

DETAILED DESCRIPTION OF THE INVENTION

Figure 1:
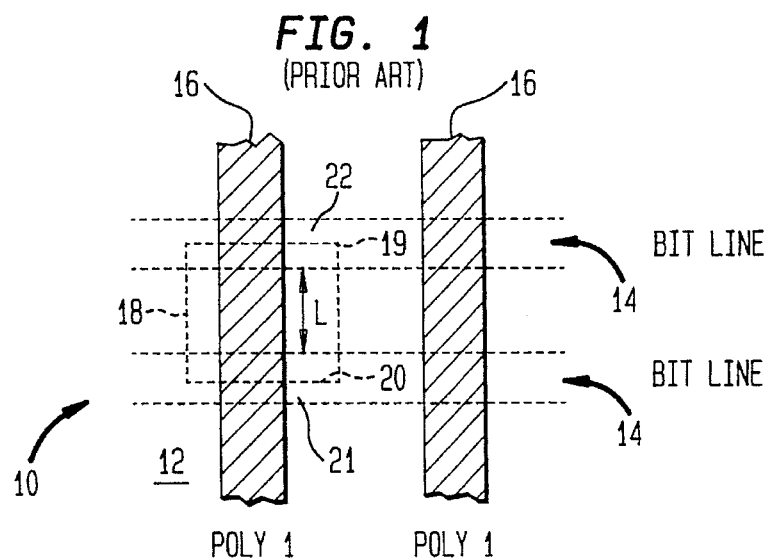
FIG. 1 schematically illustrates a prior art buried bit line ROM device.
Figure 2:
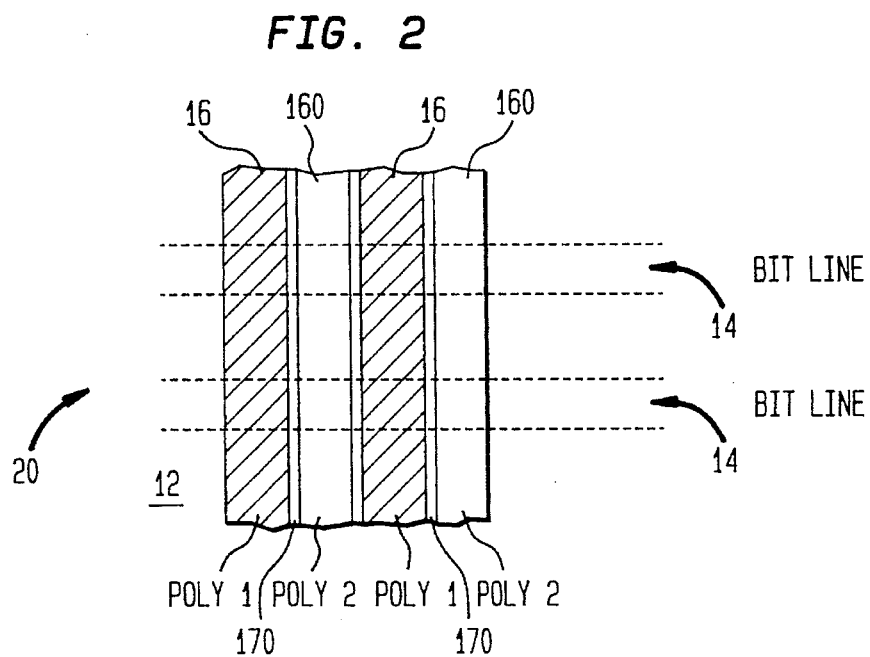
FIG. 2 illustrates a buried bit line ROM device in accordance with the present invention.

FIG. 2 shows a buried bit line ROM device 20 in accordance with the present invention. The substrate 12 and buried bit lines 14 are the same as in FIG. 1. However, the poly pitch has been decreased by a factor of two to double the cell density in the direction perpendicular to the word lines. This is accomplished through the use of a double poly process to be explained in detail below. A first poly process (poly 1) results in a first set of poly word lines 16. A second poly process (poly 2) results in a second set of poly word lines 160 which are located in between the poly word lines of the first set. The poly 1 word lines and poly 2 word lines are separated by oxide 170. Thus, the cell density in a direction perpendicular to the word line direction is doubled.

Figure 3:
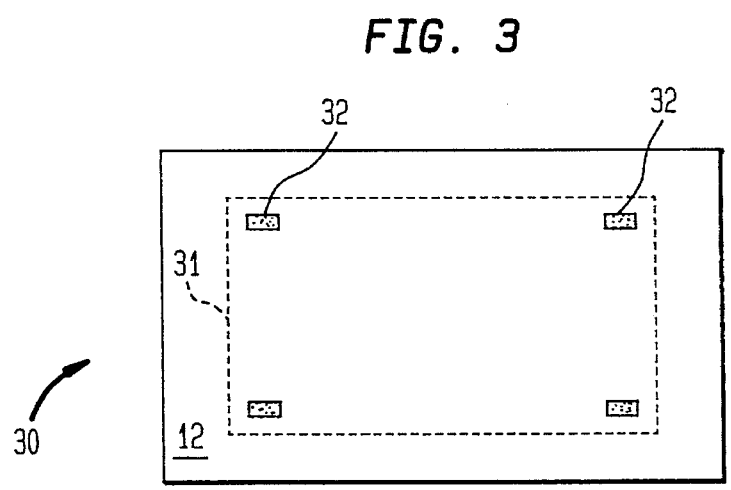
FIG. 3 illustrates the formation of nitride marks on the surface of a substrate in a buried bit line ROM device of the present invention.

The method for making the device 20 of FIG. 2 involves the use of nitride marks. The nitride marks are illustrated in FIG. 3. A single die area 30 on the substrate is shown along with the memory area 31 inside the die area. Four nitride marks 32 are shown as being located near the corners of the memory area 31.

Figure 4:
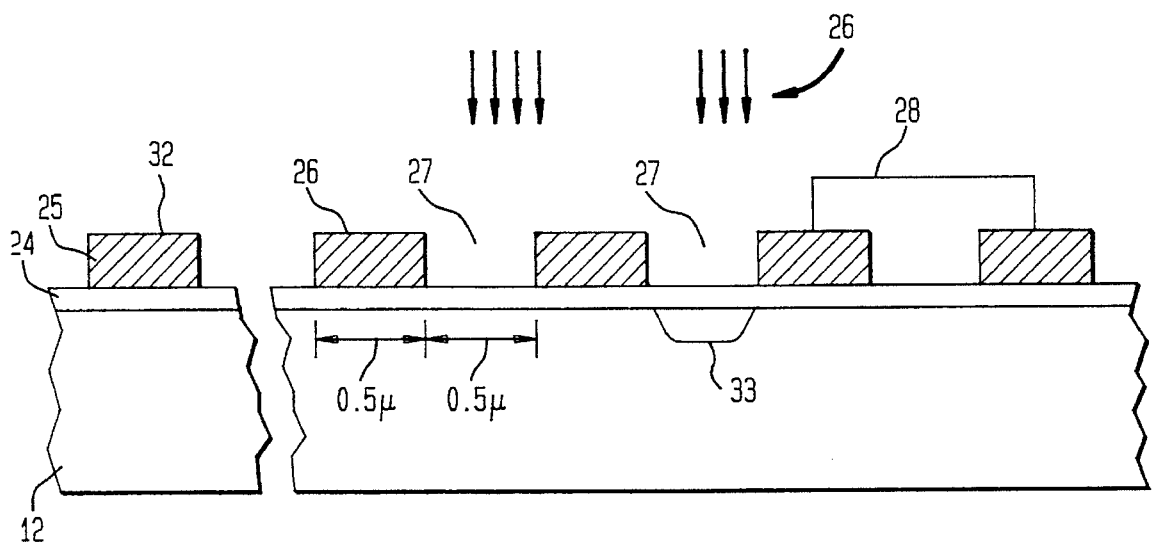
FIG. 4, FIG. 5, FIG. 6, FIG. 7, FIG. 8, FIG. 9, and FIG. 10 illustrate steps in the manufacturing of the ROM device in accordance with the invention.

Referring now to FIG. 4, there is illustrated a semiconductor substrate 12 preferably of monocrystalline silicon doped with a first type of impurity. The substrate has spaced source and drain regions (not shown). The source and drain regions in a buried bit line Read Only Memory device are formed by diffused bit lines shown in FIG. 1 and 2.

The substrate 12 is preferably P-type and is doped with boron of a concentration between 1E14 and 5E15 atoms/$cm^3$. The source and drain regions (i.e., bit lines 14) are doped with an opposite N-type impurity such as phosphorous or arsenic with a concentration of about 5E18 to 5E21. The fabrication of the bit lines is not discussed here since it is well known in the art.

A first gate oxide layer 24 with a thickness of about 200 Angstroms is formed on the surface of the substrate 12. The oxide layer 24 is formed by thermal oxidation or chemical vapor deposition. A nitride layer 25 with a thickness of about 4000 Angstroms is then deposited on top of the oxide layer 24. The oxide layer is then patterned using a photoresist and etch to form a nitride mark 32 as well as the mask portions 26. The mask portions 26 have a width of about 0.5µ and the openings 27 between the mask portions 26 have a width of about 0.5µ.

A photoresist layer 28 is deposited on the substrate 12 and patterned to selectively cover the openings 27. The uncovered openings define the desired code implantations for the cells defined by the poly 1 word lines to be formed. The resist pattern of the layer 28 does not require a precise alignment because the openings 27 in the layer 25 act as implant masks. A suitable impurity 26 is then introduced into the substrate 12 through the unmasked openings 27 resulting in regions 33. The regions 33 are channel regions which connect source and drain regions (not shown). The source and drain regions are located above and below the plane of FIG. 4. The impurity introduced by ion implantation techniques can be any suitable impurity of the same type as the background impurity of the substrate 12. The impurity is preferably boron and is introduced by ion implantation using 10 to 100 KeV and with a dose unit of about E12 to E14 atoms/cm².

Figure 5:
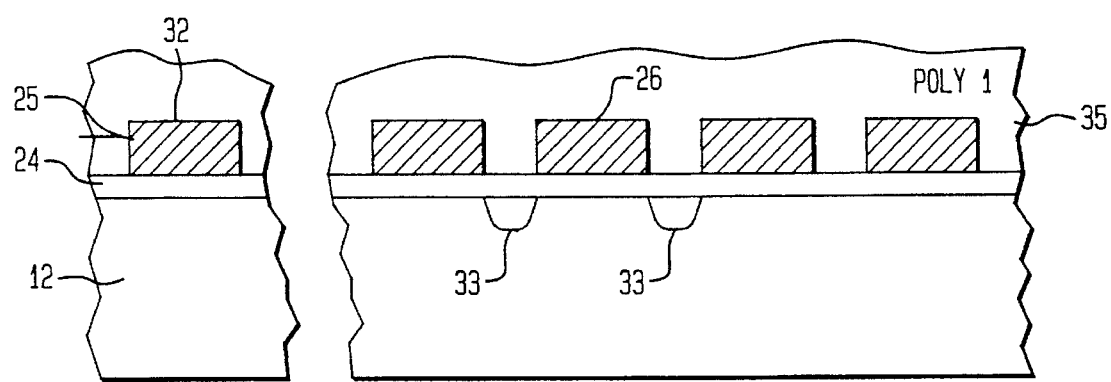

As shown in FIG. 5, the photoresist 28 is then removed and a polysilicon (poly 1) material 35 for forming the poly 1 word lines is deposited with a thickness of larger than 5000 Angstroms for example 5000–7000 Angstroms.

Figure 6:
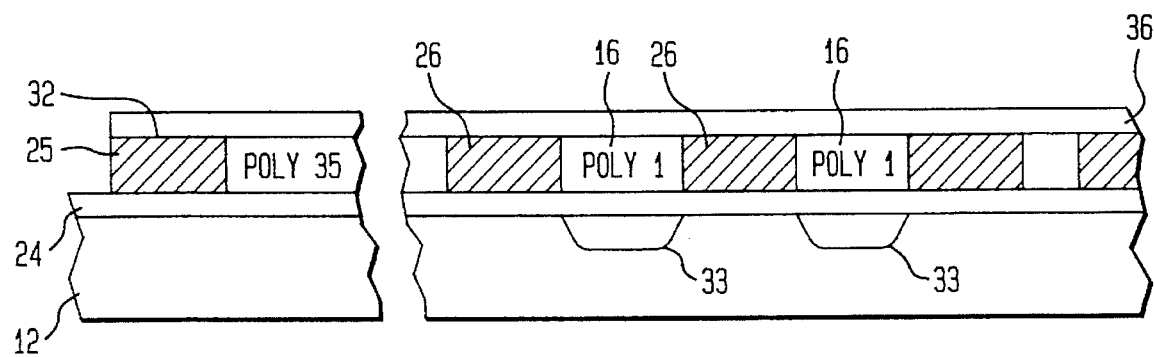

As shown in FIG. 6, the poly 1 material 35 is then removed using chemical mechanical polishing and using the nitride layer 25 as a stopper. Then chemical vapor deposition is used to form a 500 Angstrom thick oxide layer 36. The result is poly 1 word lines 16 separated by nitride lines 26 all covered by the oxide layer 36.

Figure 7:
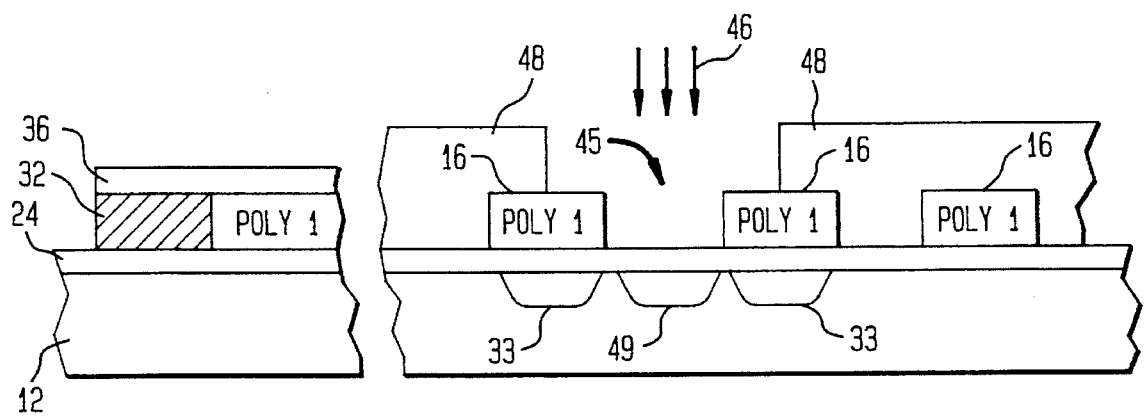

As shown in FIG. 7, the oxide layer 36 removed everywhere except for the portion which covers the nitride mark 32. This is accomplished through a masking and etching process. Then the nitride portions 26 are removed using an etch. The remaining portion of the oxide 36 prevents the nitride mark 32 from being removed by this etch.

The openings 45 between the poly 1 word lines 16 are where the nitride regions 26 were formerly located. A photoresist layer 48 is then deposited on the substrate to selectively cover the openings 45. The uncovered openings 45 define the desired code implantation for the memory cells defined by the poly 2 word lines to be formed. A suitable impurity 46 is then introduced into the substrate 12 using ion implantation resulting in the regions 49. The regions 49 are channel regions which connect source and drain regions (not shown). The source and drain regions are formed by different bit lines located about and below the plane of FIG. 7. Illustratively, the impurity introduced by ion implantation is boron using an energy of about 10 to 100 KeV and with a dose unit of about 1E13 to 1E14 atoms/cm². The next step is to remove the photoresist material 48.

Figure 8:
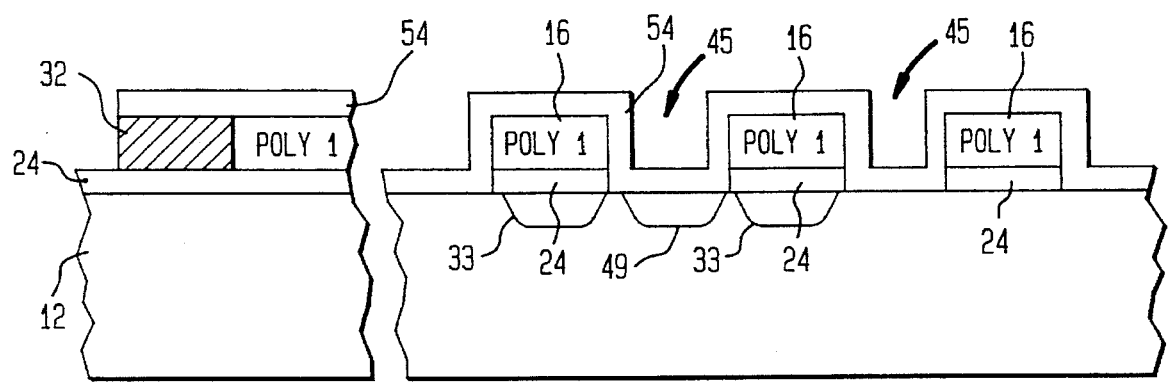

As shown in FIG. 8, the next step is to grow a second gate oxide layer 54 on the surface of the poly 1 material 16 and by regrowing the oxide in the openings 45.

Figure 9:
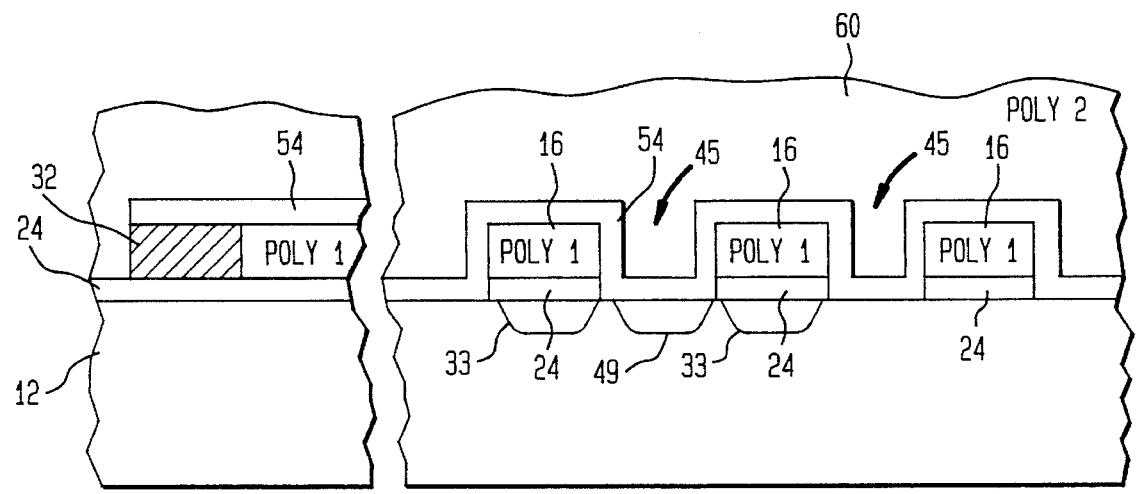

As shown in FIG. 9, the next step is to deposit a second layer 60 of poly material (poly 2) on top of the substrate 12. The second layer 60 of poly material may be 5000–7000 Angstroms thick. (As an optional step, the oxide layer 54 may be removed from the top of the nitride mask 52 using mask and etching steps before the poly 2 material 60 is deposited.)

Figure 10:
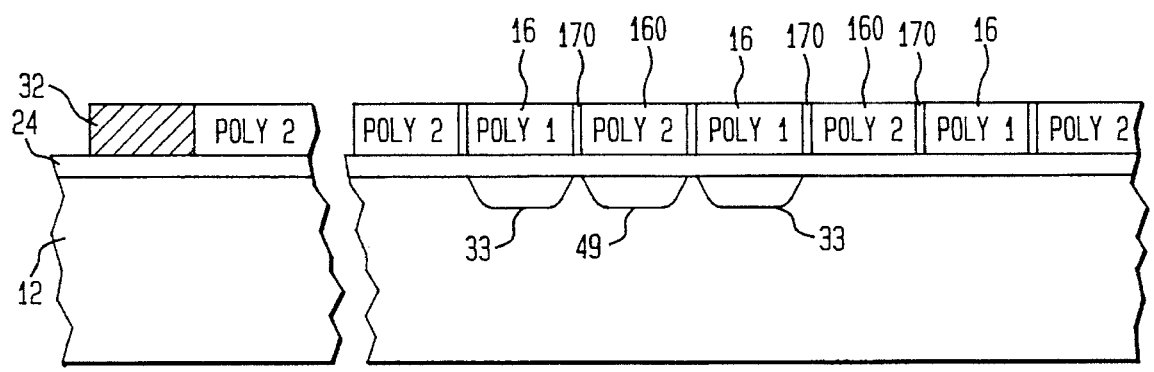

The next step as shown in FIG. 10 is chemical mechanical polishing up the poly 2 material 60 using the nitride mask 32 as a stop. The result as shown in FIG. 10 is two sets of word lines, a first set 16 formed from poly 1 material and a second set 160 formed from poly 2 material. Note that the word lines 16 and 160 are separated by the oxide 170. The resulting device is shown in FIG. 2 and as discussed above, the polypitch has been reduced by a factor of two, therefore reducing the cell density by a factor of two in a direction perpendicular to the word lines.

After the processing steps of FIG. 10 have been completed, a layer of borophospho-silicate glass (not shown) is deposited with a thickness of between 2000 to 15,000 Angstroms using conventional processing techniques. Subsequently to this, the contact opening and inter-connection metallurgy system is fabricated to form metallic contacts using conventional techniques.

Finally, the above-described embodiments of the invention are intended to be illustrative only. Numerous alternative embodiments may be devised by those skilled in the art without departing from the spirit and scope of the following claims.

We claim:

1. A read only memory device comprising:
    a semiconductor substrate having a first conductivity type,
    a plurality of marks formed on said substrate within a die area defined on said substrate, said marks having a predetermined thickness,
    a plurality of bit lines formed in said substrate in said die area and extending in a first direction, said bit lines having a second conductivity type,
    a plurality of polysilicon word lines formed on said substrate in said die area and extending in a second direction perpendicular to said first direction, each of said polysilicon wordlines being separated from an adjacent one of said polysilicon word lines by a region of insulating material, and having a thickness which equals said predetermined thickness of said marks, and
    a plurality of doped channel regions in said substrate for defining a code stored in said read only memory device,
    each of said channel regions being located under one of said wordlines and connecting a pair of adjacent bit lines.

2. The read only memory device of claim 1, wherein said plurality of marks are nitride marks.

3. The read only memory device of claim 1, wherein said region of insulating material is an oxide region.

* * * * *